US006861350B1

(12) United States Patent
Ngo et al.

(10) Patent No.: US 6,861,350 B1
(45) Date of Patent: Mar. 1, 2005

(54) METHOD OF MANUFACTURING SEMICONDUCTOR DEVICE COMPRISING SILICON-RICH TASIN METAL GATE ELECTRODE

(75) Inventors: Minh Van Ngo, Fremont, CA (US); Christy Mei-Chu Woo, Cupertino, CA (US); Jinsong Yin, Sunnyvale, CA (US); James Pan, Fishkill, NY (US); Paul R. Besser, Sunnyvale, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 97 days.

(21) Appl. No.: 10/464,508

(22) Filed: Jun. 19, 2003

(51) Int. Cl.[7] .................. H10L 21/4763; H10L 21/44
(52) U.S. Cl. .................. 438/627; 438/643; 438/653
(58) Field of Search .................. 438/622–633, 438/643–657, 719, 753

(56) References Cited

U.S. PATENT DOCUMENTS

| | | | |
|---|---|---|---|
| 5,998,873 A * | 12/1999 | Blair et al. .................. 257/766 |
| 6,084,280 A * | 7/2000 | Gardner et al. .............. 257/412 |
| 6,350,675 B1 * | 2/2002 | Chooi et al. ................. 438/624 |
| 6,368,923 B1 * | 4/2002 | Huang .......................... 438/275 |
| 6,444,512 B1 * | 9/2002 | Madhukar et al. ........... 438/203 |
| 6,596,643 B2 * | 7/2003 | Chen et al. .................. 438/706 |
| 6,607,958 B2 * | 8/2003 | Suguro ......................... 438/287 |
| 6,680,249 B2 * | 1/2004 | Lu et al. ....................... 438/653 |
| 6,723,635 B1 * | 4/2004 | Ngo et al. .................... 438/627 |
| 6,727,560 B1 * | 4/2004 | Pan et al. ..................... 257/412 |
| 2003/0027393 A1 * | 2/2003 | Suguro ......................... 438/287 |

\* cited by examiner

*Primary Examiner*—Michael Lebentritt

(57) ABSTRACT

Micro-miniaturized semiconductor devices are fabricated with silicon-rich tantalum silicon nitride replacement metal gate electrodes. Embodiments include removing a removable gate, depositing a layer of tantalum nitride, as by PVD at a thickness of 25 Å to 75 Å, and then introducing silicon into the deposited tantalum nitride layer by thermal soaking in silane or silane plasma treatment to form a layer of silicon-rich tantalum silicon nitride. In another embodiment, the intermediate structure is subjected to thermal soaking in silane or silane plasma treatment before and after depositing the tantalum nitride layer. Embodiments further include pretreating the intermediate structure with silane prior to depositing the tantalum nitride layer, treating the deposited tantalum nitride layer with silane, and repeating these steps a number of times to form a plurality of sub-layers of silicon-rich tantalum silicon nitride.

20 Claims, 8 Drawing Sheets

METHOD OF MANUFACTURING SEMICONDUCTOR DEVICE COMPRISING SILICON-RICH TASIN METAL GATE ELECTRODE

FIELD OF THE INVENTION

The present invention relates to semiconductor devices comprising transistors with metal gate electrodes and to fabrication techniques for engineering a metal gate electrode with a tunable work function. The present invention is particularly applicable to fabricating high speed semiconductor devices having submicron design features.

BACKGROUND ART

The integration of hundreds of millions of circuit elements, such as transistors, on a single integrated circuit necessitates further dramatic scaling down or microminiaturization of the physical dimensions of circuit elements, including interconnection structures. Microminiaturization has engendered a dramatic increase in transistor engineering complexity, such as the inclusion of graded well-doping, epitaxial wafers, halo implants, tip implants, lightly doped drain structures, multiple implants for source/drain regions, silicidation of gates and source/drains, and multiple sidewall spacers, for example.

The drive for high performance requires high speed operation of microelectronic components requiring high drive currents in addition to low leakage, i.e., low off-state current, to reduce power consumption. Typically, the structural and doping parameters tending to provide a desired increase in drive current adversely impact leakage current.

Recently, metal gate electrodes have evolved for improving the drive current by reducing polysilicon depletion. Simply replacing high resistance polysilicon gate electrodes with metal gate electrodes may engender issues such as, increased leakage current because of an undesired value of the work function which, in turn, provides undesired electrical characteristics for the transistor. The work function is the amount of energy required to excite electrons across a threshold. Polysilicon gates on silicon substrate provide a work function that allows the gates to be adequately controlled. The work function of $n^+$ and $p+$ polysilicon is near to either the conduction or valence band and cannot be altered. The metal gate technique makes it feasible to modify the threshold voltage of micro-miniaturized CMOS device without performing adjustment implants which become difficult with aggressive scaling of the CMOS channel length. However, the use of a metal gate electrode on a silicon substrate undesirably alters the work function vis-à-vis polysilicon, thereby reducing the controllability of the gate.

Accordingly, a need exists for methodology enabling the fabrication of micro-miniaturized semiconductor devices comprising transistors with metal gate electrodes having a tunable work function.

DISCLOSURE OF THE INVENTION

An advantage of the present invention is a semiconductor device comprising a transistor with a metal gate electrode having a tunable work function.

Another advantage of the present invention is a method of manufacturing a semiconductor device comprising a transistor with a metal gate electrode having a tunable work function.

Additional advantages and other features of the present invention will be set forth in the description which follows and, in part, will become apparent to those having ordinary skill in the art upon examination of the following or may be learned from the practice of the present invention. The advantages of the present invention may be realized and obtained as particularly pointed out in the appended claims.

According to the present invention, the foregoing and other advantages are achieved in part by a method of manufacturing a semiconductor device, the method comprising: forming a removable gate over a substrate with a gate dielectric layer therebetween; forming a dielectric layer over the substrate and exposing an upper surface of the removable gate; removing the removable gate leaving an opening in the dielectric layer, thereby forming an intermediate structure; depositing a layer of tantalum nitride lining the opening; and introducing silicon into the deposited layer of tantalum nitride to form a layer of tantalum silicon nitride.

Embodiments of the present invention include treating the deposited layer of tantalum nitride with silane, as by heat soaking or plasma treatment, to form a silicon-rich tantalum silicon nitride layer having a silicon content of 5 to 20 at. % at the metal gate/gate dielectric interface, while the concentration of silicon throughout the tantalum nitride layer is below detection level. Silane treatment may be performed on the intermediate structure and subsequent to depositing the tantalum nitride layer. Embodiments of the present invention further include silane treating the gate dielectric prior to depositing tantalum nitride, then applying another silane treatment after tantalum nitride deposition. The work function is primarily dictated by the first approximately 30 A° of metal gate in direct contact with the gale dielectric. Any material more than the first 30 A° will not materially affect the work function. A plurality of distinct tantalum nitride layers, each with silane treatment, may be formed such that the total thickness is no greater than 40 A° to 50 A°, having a silicon content of 10 to 35 at. %, at the metal gate/gate dielectric interface.

Another aspect of the present invention is a semiconductor device comprising a transistor having a metal gate electrode, the metal gate electrode comprising a layer of silicon-rich tantalum silicon nitride with a silicon content of 5 to 35 at. %.

Embodiments of the present invention further include forming the metal gate electrode with a layer of tantalum silicon nitride comprising a plurality of silicon-rich tantalum silicon nitride sub-layers with an interface between each joining sub-layer.

After forming the silicon-rich tantalum silicon nitride layer, a metal, such as copper (Cu) or a Cu alloy, is deposited and then planarized, as by chemical mechanical polishing (CMP) such that upper surfaces of the deposited Cu or Cu alloy layer and the tantalum silicon nitride layer or sub-layers are substantially coplanar with the upper surface of the dielectric layer. Embodiments of the present invention further include forming the titanium nitride layer at a thickness of 25 Å to 75 Å, or the titanium nitride sub-layers at a thickness of 10 Å to 15 Å.

Additional advantages of the present invention will become readily apparent to those skilled in this art from the following detailed description, wherein embodiments of the present invention are described, simply by way of illustration of the best mode contemplated for carrying out the present invention. As will be realized, the present invention is capable of other and different embodiments, and its several details are capable of modification in various obvious respects, all without departing from the present invention. Accordingly, the drawings and description are to be regarded as illustrative in nature, and not as restrictive.

BRIEF DESCRIPTION OF DRAWINGS

FIGS. 1 through 7, similar features are denoted by similar reference characters.

DESCRIPTION OF THE INVENTION

Figure 1:
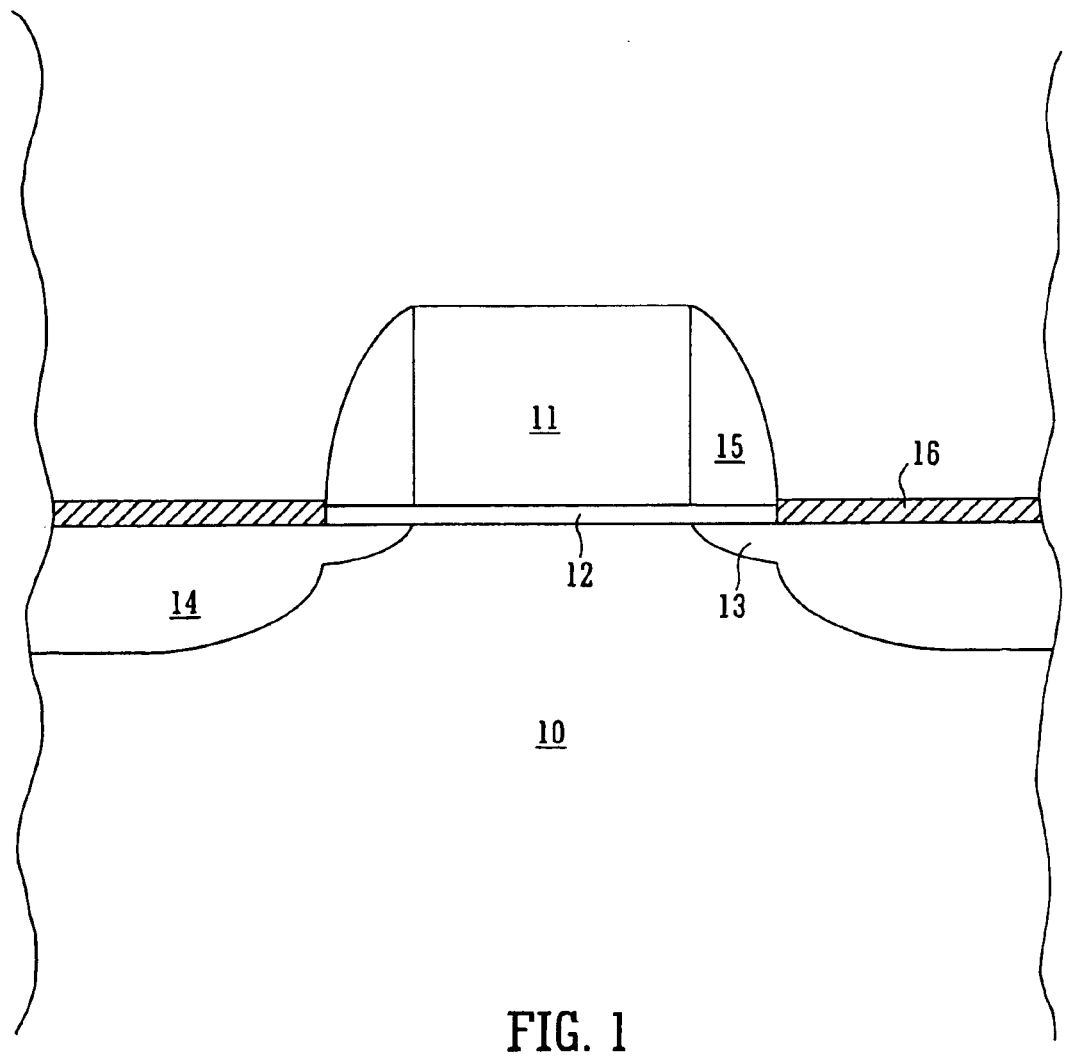
FIGS. 1 through 6 schematically illustrate sequential phases of a method in accordance with an embodiment of the present invention.

The present invention addresses and solves problems attendant upon conventional practices of forming polysilicon gate electrodes stemming from their high resistivity and, hence, slower speed. The present invention also addresses and solves problems attendant upon the use of metal gates to replace polysilicon gates. The present invention addresses and solves such problems by providing methodology enabling the fabrication of semiconductor devices comprising transistors having a metal gate electrode with a tunable work function, thereby enabling tailoring of the work function of the metal gate electrode.

After conducting extensive experimentations and investigations, it was found that the work function of tantalum silicon nitride is significantly more sensitive to the nitrogen and silicon contents than previously believed. Accordingly, the present invention stems in part from the discovery that the work function of tantalum silicon nitride can be altered, such as increased by incorporating additional silicon into tantalum silicon nitride. Conventional tantalum silicon nitride typically has a silicon content of 0.5 to 50 at. %. In accordance with embodiments with the present invention, metal gate electrodes are formed with a layer of silicon-rich tantalum silicon nitride having a silicon content of 5 to 35 at. % at the metal gate/gate dielectric interface and very low to below detection limit throughout most of the metal gate electrode.

Embodiments of the present invention comprise forming a silicon-rich layer of tantalum silicon nitride by depositing an initial layer of tantalum nitride, as by physical vapor deposition (PVD), as at a thickness of 25 Å to 75 Å. Subsequently, the deposited layer of tantalum nitride is treated with silane to convert the tantalum nitride layer into a silicon-rich layer of tantalum silicon nitride at the gate dielectric interface. Such treatment with silane may be implemented by thermal soaking or by plasma treatment in a conventional plasma enhanced chemical vapor deposition (PECVD) chamber.

Embodiments of the present invention include treating the intermediate structure with silane prior to depositing the layer of tantalum nitride, as by thermal soaking or plasma treatment. Embodiments of the present invention also include pretreating the intermediate structure with silane, depositing a sub-layer of tantalum nitride, as at a thickness of 10 Å to 15 Å, followed by silane treatment, and repeating the deposition of a tantalum nitride sub-layer and silane treatment a plurality of times, thereby forming a plurality of sub-layers of silicon-rich tantalum silicon nitride with an interface between each sub-layer, such as forming a composite silicon-rich tantalum silicon nitride layer having three sub-layers of tantalum silicon nitride.

In accordance with embodiments of the present invention, thermal soaking of the intermediate structure and deposited tantalum nitride layers may be implemented at a pressure of 3 to 6 Torr, temperature of 250° C. to 550° C. and silane flow rate of 400 to 1,000 sccm, as for 10 to 60 seconds. According to embodiments of the present invention, plasma treatment of the intermediate structure and deposited silicon nitride layers may be implemented at a pressure of 2 to 4 Torr, temperature of 350° C. to 450° C., an RF power of 100 to 250 watts, and a silane flow rate of 60 to 110 sccm, as for 5 to 30 seconds. It should be understood that silane treatment of the intermediate structure and deposited tantalum nitride layers need not be implemented in the same manner. For example, the substrate may be heat-soaked in silane and the deposited tantalum nitride layers may be plasma treated, or vice versa. In accordance with the present invention, the intermediate structure and deposited tantalum nitride layers may also be silane treated in the same manner, e.g., by heat soaking or plasma treatment.

An embodiment of the present invention is schematically illustrated in FIGS. 1 through 6. Adverting to FIG. 1, a temporary replaceable or dummy gate 11, such as polysilicon, is formed over substrate 10 with a gate dielectric layer 12 therebetween, such as silicon oxide. Embodiments of the present invention also include depositing a high dielectric constant material for the gate dielectric layer 12, such as $ZrO_2$, $HfO_2$, $InO_2$, $LaO_2$ and $TaO_2$. Shallow source/drain extensions of 13 are formed, and dielectric sidewall spacers 15, such as silicon oxide, silicon nitride or silicon oxynitride, are then formed on the removable gate 11. Ion implantation is then conducted to form deep source/drain regions 14, followed by silicidation to form metal silicide layer 16 on the exposed surfaces of the source/drain regions 13, such as nickel silicide. The manipulative steps illustrated in FIG. 1 are implemented in a conventional manner.

Figure 2:
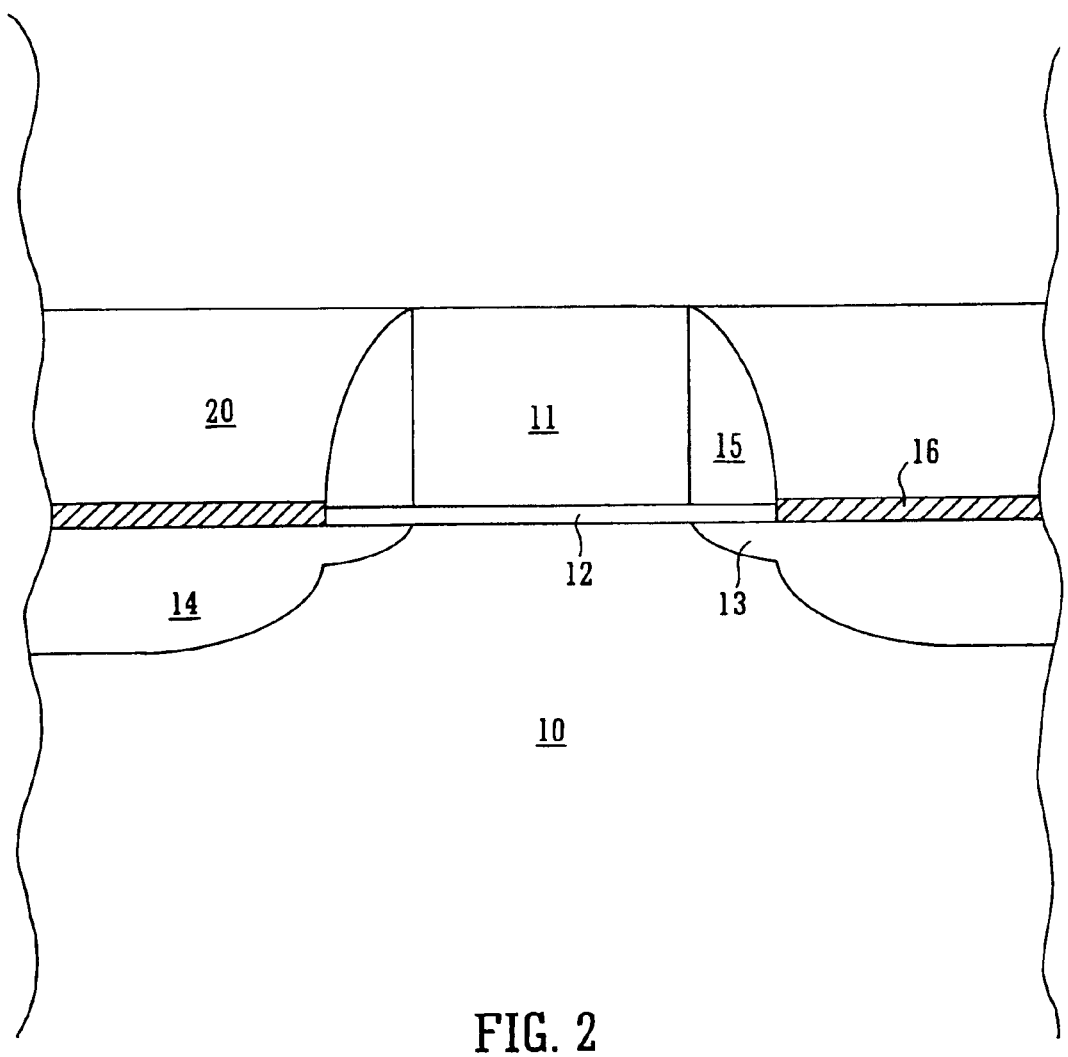

Adverting to FIG. 2, a layer of dielectric material, such as silicon oxide, e.g., silicon oxide formed from tetraethyl orthosilicate (MOS), is deposited followed by CMP forming layer 20. It should be understood that shallow source/drain extensions 13 and source/drain regions 14 are activated by high temperature thermal annealing, such as at a temperature of about 900° C. and above, at the stage illustrated in FIG. 1, or FIG. 2 or even at the stage illustrated in FIG. 3, prior to depositing the replacement metal gate electrode.

Figure 3:
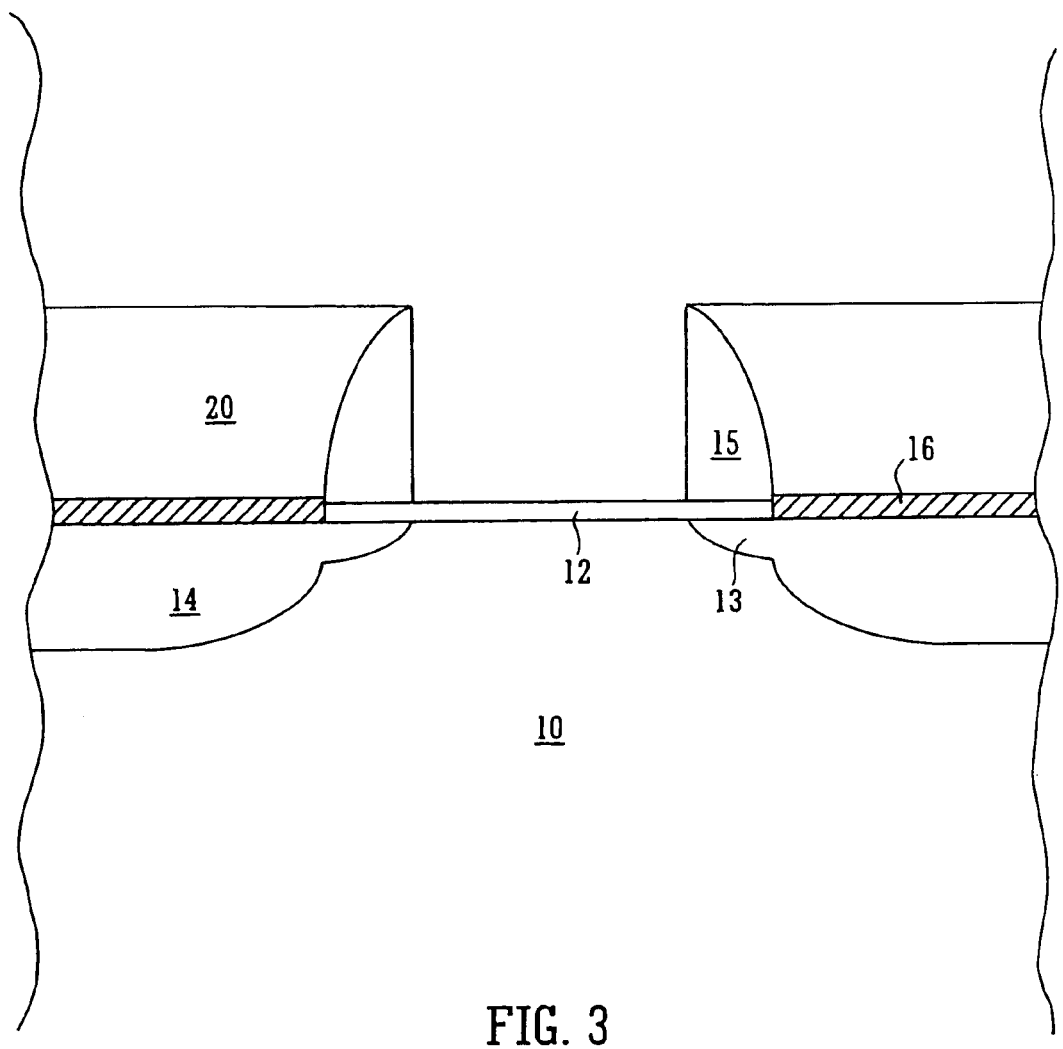
Figure 4:
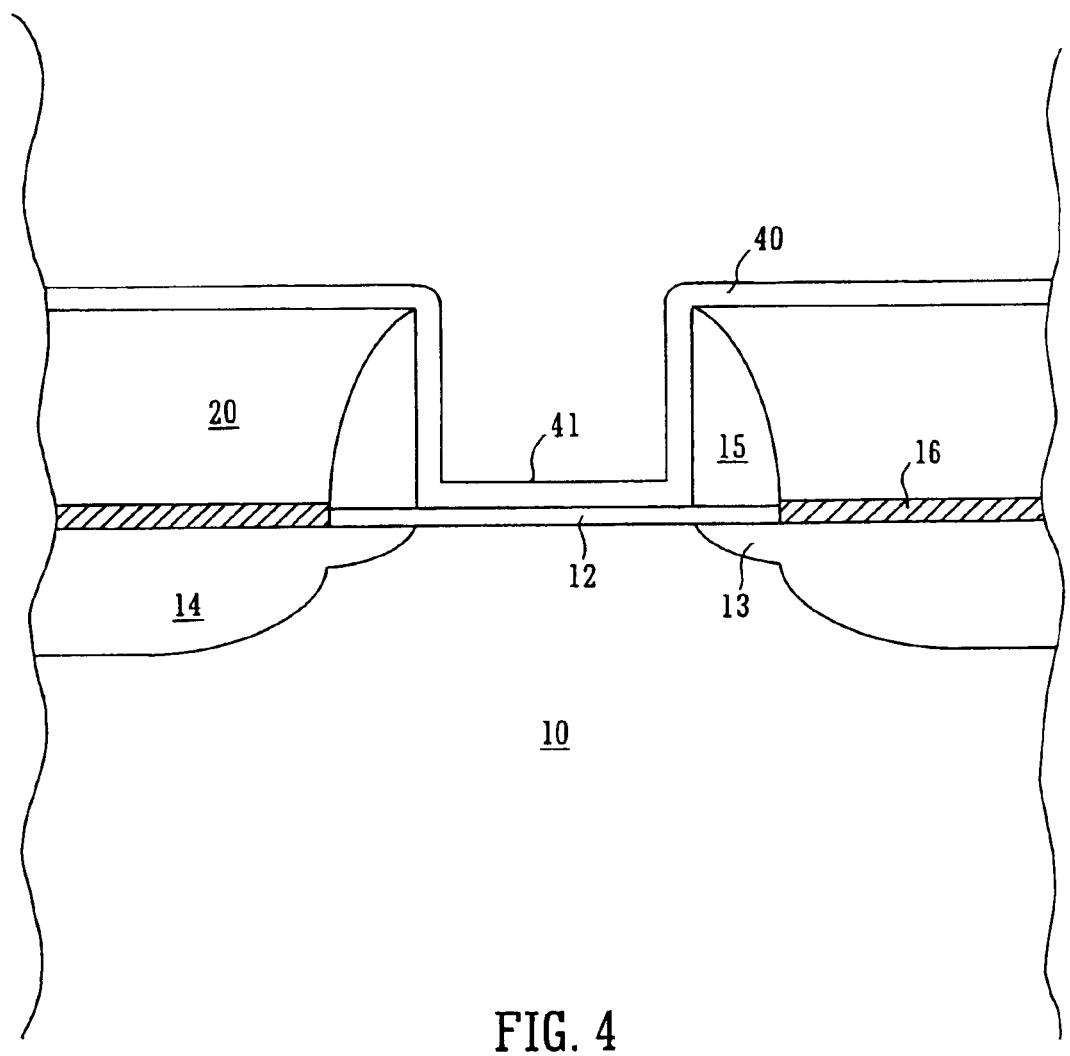

As illustrated in FIG. 3, replacement or dummy gate 11 is removed, as by etching, e.g., reactive ion etching (RIE). In accordance with an embodiment of the present invention, a layer of tantalum nitride 40 is deposited lining the opening created by removing the dummy polysilicon gate 11, as illustrated in FIG. 4. Embodiments of the present invention include depositing tantalum nitride layer 40 by PVD at a DC voltage of 0.7 to 10 kw and at a temperature of 25° C. to 50° C. Typically, tantalum nitride layer 40 is deposited at a thickness of about 25 Å to about 75 Å. Gate dielectric layer 12 is typically formed at a thickness of less than 15 Å, such as 5 Å to 15 Å.

Figure 4A:
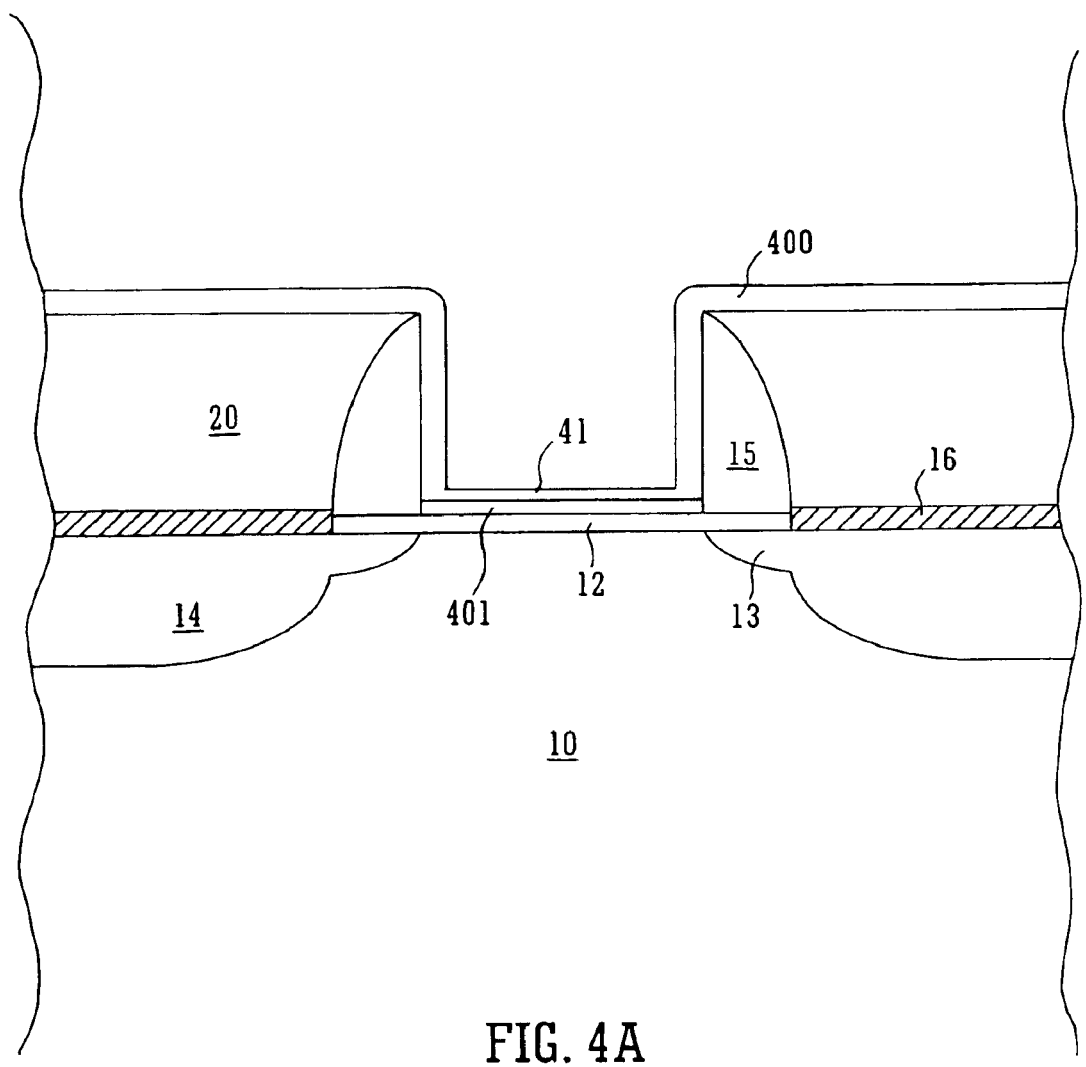

In accordance with embodiments of the present invention, the deposited tantalum nitride layer 40 is then converted into a tantalum silicon nitride layer 400, which has a silicon-rich layer 401 at the gate dielectric interface, schematically illustrated in FIG. 4A, by treatment with silane. Silane treatment may be implemented by thermal soaking in silane or by plasma treatment in silane, employing a PECVD chamber. In another embodiment of the present invention, the intermediate structure schematically illustrated in FIG. 3 may be treated with silane, as by thermal soaking or plasma treatment, and repeating silane treatment subsequent to depositing the tantalum nitride layer 40. Silane treatment can be controlled to introduce a desired amount of silicon such that the silicon-rich tantalum silicon nitride layer has a tunable work function.

Figure 5:
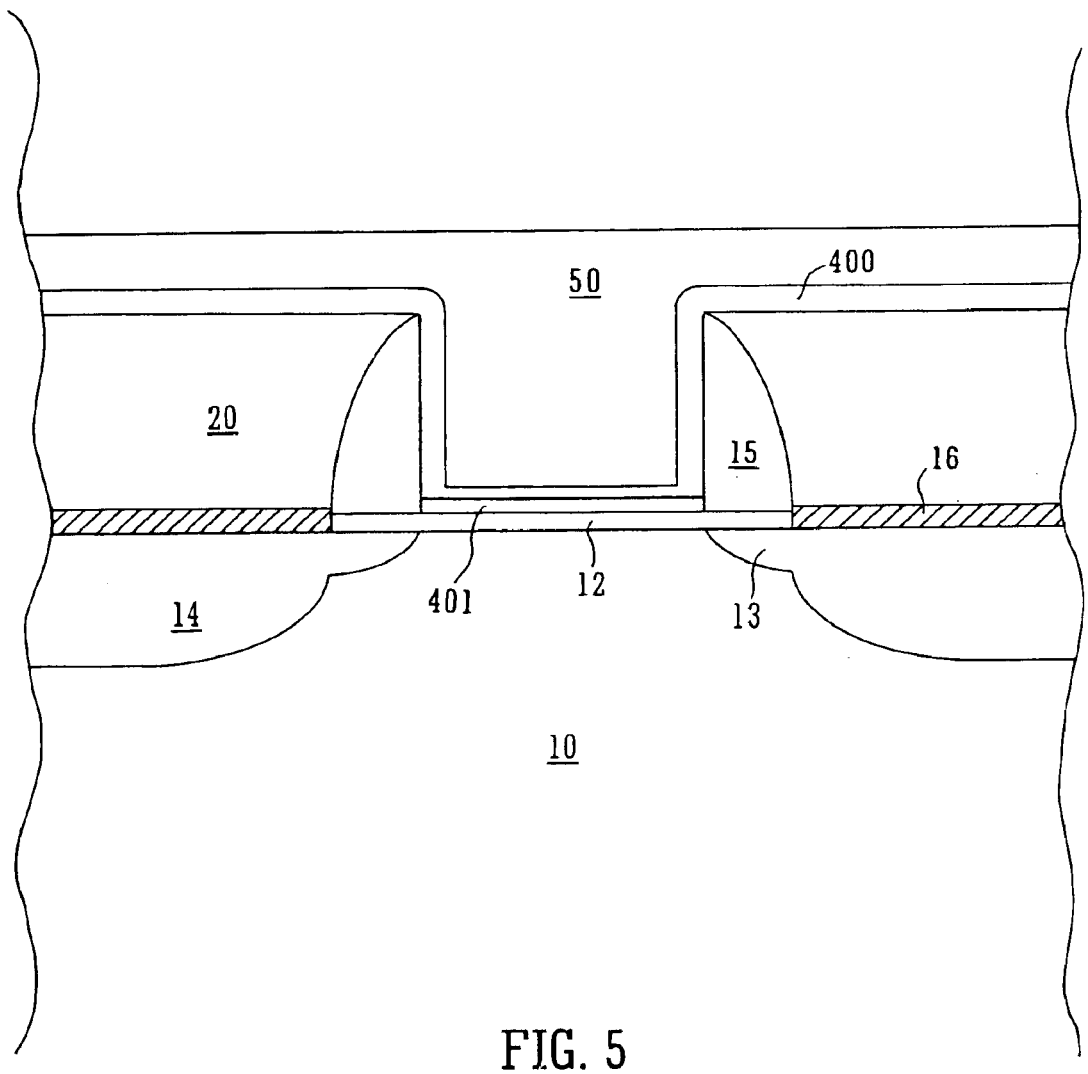

Subsequently, as illustrated in FIG. 5, a layer of conductive material 50, such as tantalum (Ta), copper (Cu) or a Cu alloy is deposited. As used throughout this application the symbol Cu is intended to encompass high purity elemental copper as well as Cu-based alloys, such as Cu alloys containing minor amounts of tantalum, indium, tin, zinc, manganese, titanium, magnesium, chromium, germanium, strontium, platinum, aluminum or zirconium. Other suitable metals include nickel, ruthenium, cobalt, molybdenum and alloys thereof.

Figure 6:
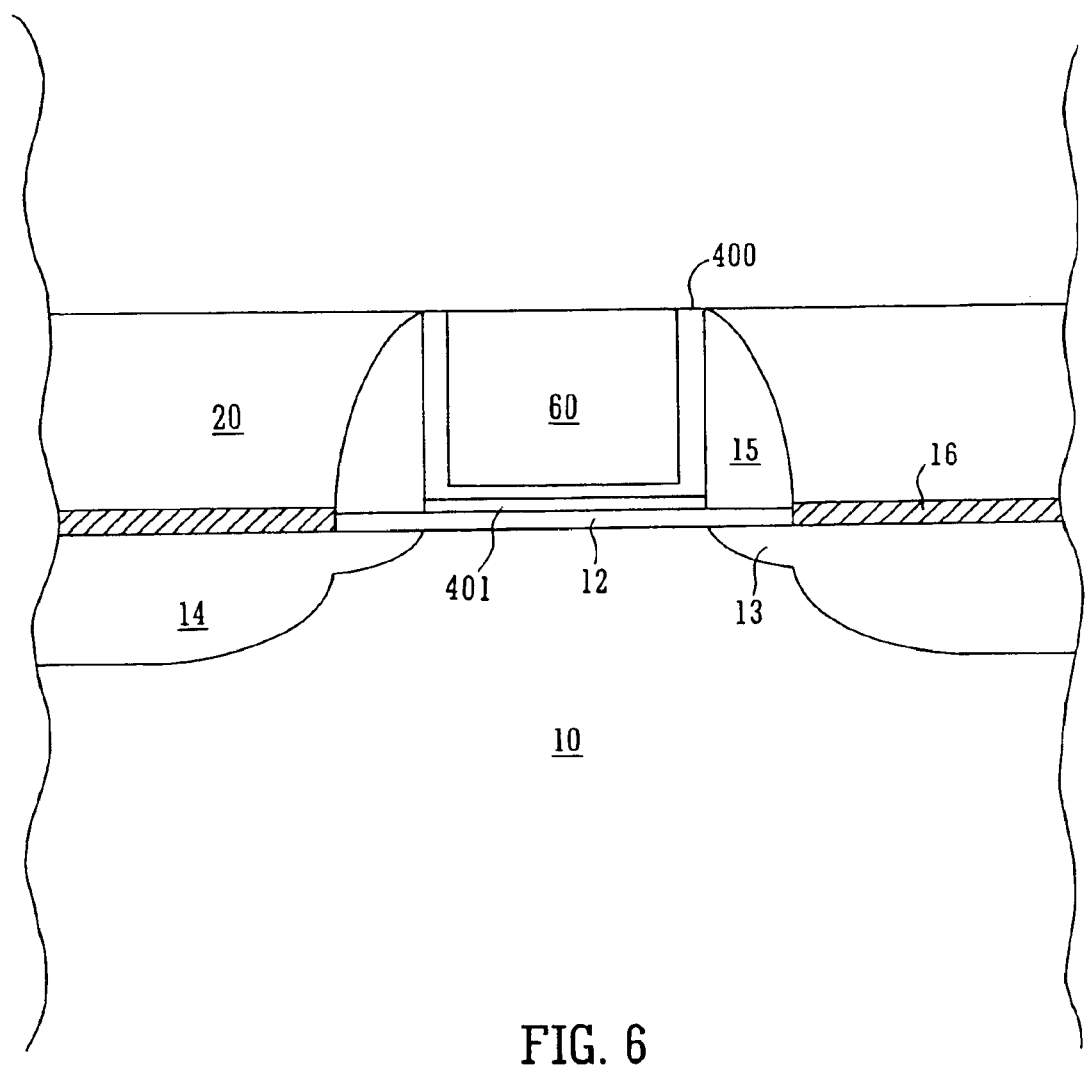
Figure 7:
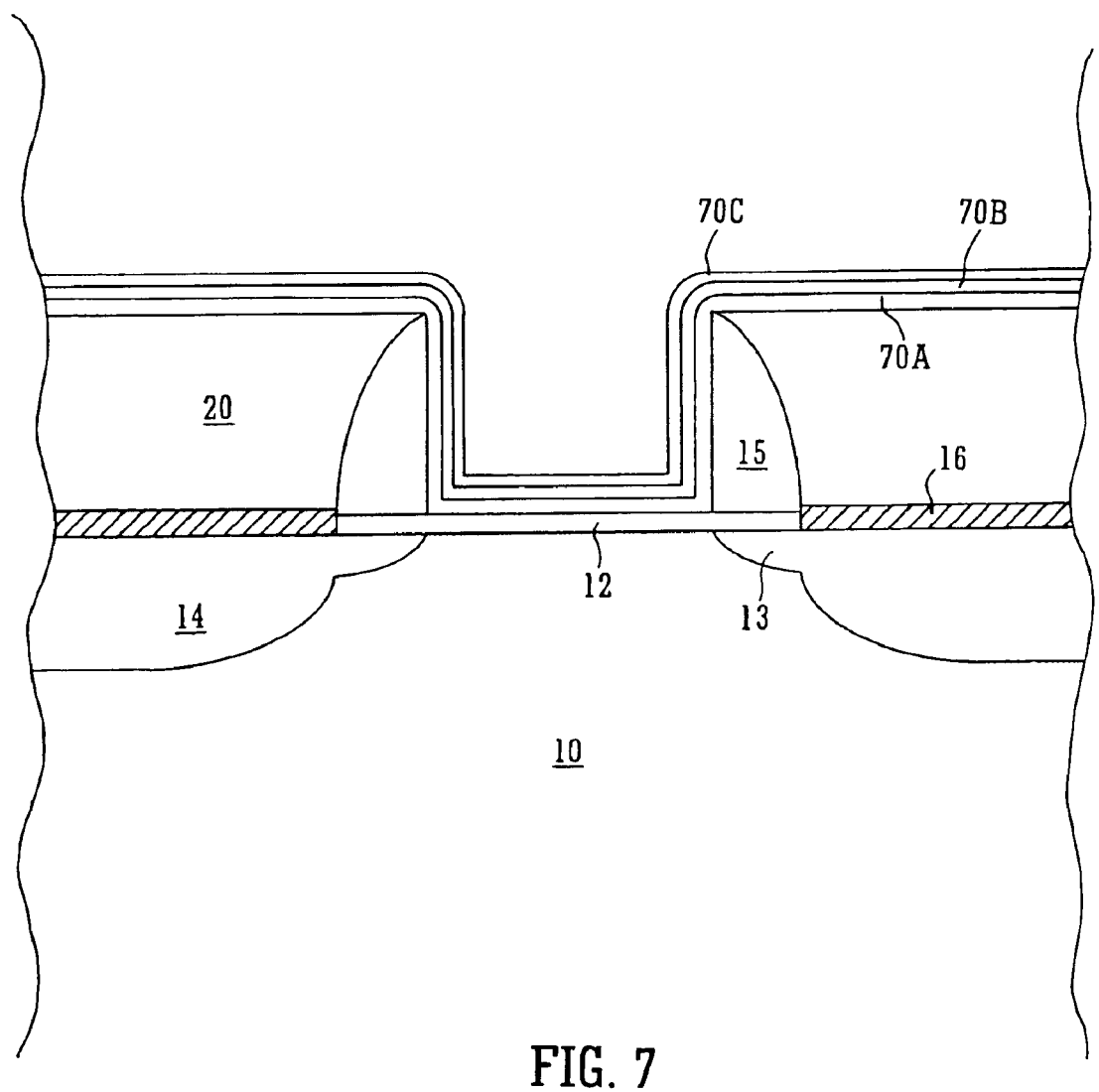
FIG. 7 represents another embodiment of the present invention.

CMP is then implemented to planarize the upper surface, of the deposited conductive material, thereby completing the metal gate structure comprising silicon-rich tantalum silicon nitride layer 400 the Cu portion 60 as illustrated in FIG. 6.

In another embodiment of the present invention, after silane treatment of the intermediate structure illustrated in FIG. 3, a plurality of titanium nitride sub-layers are deposited, as by PVD, as at a thickness of 10 Å, to 15 Å each, followed by silane treatment of each deposited sub-layer, resulting in the formation of a composite silicon-rich tantalum silicon nitride layer comprising individual silicon-rich tantalum silicon nitride sub-layers 70A, 70B, and 70C, with an interface therebetween. This embodiment offers the advantage of improving the distribution of silicon throughout the entire metal gate, thereby improving the accuracy of the tunable work function.

The present invention is not limited to the foregoing embodiments. For example, silicon carbon or phosporous can be introduced as an impurity in various other gate electrode metals, such as physical vapor deposited titanium, tungsten or molybdenum, chemical vapor deposited titanium nitride or tungsten nitride, in atomic layer deposited tantalum nitride or tungsten nitride.

The present invention provides methodology enabling the fabrication of semiconductor devices comprising transistors with metal gate electrodes having a tunable work functions. The present invention enables modification of the threshold voltage of micro-miniaturized CMOS devices with a very short channel lengths, such as a channel length less than 650 Å.

The present invention enjoys industrial applicability in the fabrication of various types of semiconductor devices. The present invention is particularly applicable in fabricating semiconductor devices having submicron features and exhibiting a high drive current and minimized leakage current.

In the previous description, numerous specific details are set forth, such as specific materials, structures, chemicals, processes, etc., to provide a better understanding of the present invention. However, the present invention can be practiced without resorting to the details specifically set forth. In other instances, well known processing and materials have not been described in detail in order not to unnecessarily obscure the present invention.

Only the preferred embodiment of the present invention and but a few examples of its versatility are shown and described in the present application. It is to be understood that the present invention is capable of use in various other combinations and environments, and is capable of changes or modifications within the scope of the inventive concept as expressed herein.

What is claimed is:

1. A method of manufacturing a semiconductor device, the method comprising:

forming a removable gate over a substrate with a gate dielectric layer therebetween;

forming a dielectric layer over the substrate and exposing an upper surface of the removable gate;

removing the removable gate leaving an opening in the dielectric layer, thereby forming an intermediate structure;

depositing a layer of tantalum nitride lining the opening; and introducing silicon into the deposited layer of tantalum nitride to form a layer of tantalum silicon nitride, which has a silicon-rich layer at the metal gate/gate dielectric interface.

2. A method according to claim 1, comprising forming the layer of silicon-rich tantalum silicon nitride with a silicon content of 5 to 35 at. % at the metal gate/gate dielectric interface, while the remainder of the tantalum nitride layer has a lower silicon content.

3. The method according to claim 1, further comprising:

depositing a layer of metal filling the opening; and planarizing such that an upper surfaces of the metal filling the opening and the tantalum silicon nitride layer are substantially coplanar with the upper surface of the dielectric layer.

4. The method according to claim 1, comprising treating the deposited tantalum nitride layer with silane to form the tantalum silicon nitride layer.

5. The method according to claim 4, comprising depositing the layer of tantalum nitride at a thickness of 25 Å to 75 Å.

6. The method according to claim 4, comprising treating the tantalum nitride layer by thermal soaking in silane.

7. The method according to claim 6, comprising thermal soaking the tantalum nitride layer at:

a pressure 3 to 6 Torr;

a temperature of 250° C. to 550° C.; and a silane flow rate of 400 to 1,000 sccm; for 10 to 60 seconds.

8. The method according to claim 4, comprising treating the tantalum nitride layer with a silane plasma.

9. The method according to claim 8, comprising plasma treating the tantalum nitride layer at:

a pressure of 2 to 4 Torr;

a temperature of 350° C. to 450° C.;

an RF power of 100 to 250 watts; and a silane flow rate of 60 to 110 sccm; for 5 to 30 seconds.

10. The method according to claim 4, comprising treating the intermediate structure with silane before depositing the tantalum nitride layer.

11. The method according to claim 10, comprising treating the intermediate structure by thermal soaking in silane or by plasma treatment with silane.

12. The method according to claim 11, comprising thermal soaking the intermediate structure at:

a pressure of 3 to 6 Torr;

a temperature of 250° C. to 550° C.; and a silane flow rate of 400 to 1000 sccm; for 10 to 60 seconds.

13. The method according to claim 11, comprising plasma treating the intermediate structure at:

a pressure of 2 to 4 Torr;

a temperature of 350° C. to 450° C.;

an RF power of 100 to 250 watts; and a silane flow rate of 60 to 110 sccm; for 5 to 30 seconds.

14. The method according to claim 1, comprising the steps:

(a) treating the intermediate structure with silane;
(b) depositing a sub-layer of tantalum nitride;
(c) treating the deposited sub-layer of tantalum nitride with silane; and
(d) repeating steps (b) and (c).

15. The method according to claim 14, comprising depositing the sub-layer of tantalum nitride in step (b) at a thickness of 10 Å to 15 Å.

16. The method according to claim 14, comprising performing steps (b) and (c) three times to form three sub-layers of silicon-rich tantalum silicon nitride having an interface between each sub-layer.

17. The method according to claim 14, comprising performing steps (a) and/or (c) by thermal soaking at:
   a pressure of 3 to 6 Torr;
   a temperature of 250° C. to 550° C.; and
   a silane flow rate of 400 to 1,000 sccm; for 10 to 60 seconds.

18. The method according to claim 14, comprising performing steps (a) and/or (c) by plasma treatment at:
   a pressure of 2 to 4 Torr;
   a temperature of 350° C. to 450° C.; and
   an RF power of 100 to 250 watts; and
   a silane flow rate of 60 to 110 sccm; for
   5 to 30 seconds.

19. A semiconductor device comprising a transistor having a metal gate electrode on a gate dielectric, the metal gate electrode comprising a layer of tantalum nitride and a layer of silicon-rich tantalum silicon nitride with a silicon content of 5 to 35 at. % at the metal gate/gate dielectric interface.

20. A method of manufacturing a semiconductor device comprising a tuned metal gate electrode, the method comprising:
   forming a removable gate over a substrate with a gate dielectric layer therebetween;
   forming a dielectric layer over the substrate and exposing an upper surface of the removable gate;
   removing the removable gate leaving an opening in the dielectric layer;
   depositing a conductive layer lining the opening; and
   introducing an impurity into the conductive layer to form an impurity-rich conductive layer at the interface between the metal gate electrode and gate dielectric layer.

* * * * *